(12) United States Patent
Lam et al.

(10) Patent No.: US 11,136,202 B2
(45) Date of Patent: Oct. 5, 2021

(54) DIRECT TRANSFER APPARATUS FOR ELECTRONIC COMPONENTS

(71) Applicant: ASM Technology Singapore Pte Ltd, Singapore (SG)

(72) Inventors: Kui Kam Lam, Hong Kong (HK); Kai Siu Lam, Hong Kong (HK); Yen Hsi Tang, Hong Kong (HK); Hung Kit Chan, Hong Kong (HK); Ka Yee Mak, Hong Kong (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 102 days.

(21) Appl. No.: 16/734,465

(22) Filed: Jan. 6, 2020

(65) Prior Publication Data
US 2021/0206585 A1    Jul. 8, 2021

(51) Int. Cl.
| | |
|---|---|
| *H01L 21/67* | (2006.01) |
| *B65G 47/90* | (2006.01) |
| *H01L 21/683* | (2006.01) |
| *H01L 21/677* | (2006.01) |

(52) U.S. Cl.
CPC ............ *B65G 47/90* (2013.01); *H01L 21/677* (2013.01); *H01L 21/67132* (2013.01); *H01L 21/67259* (2013.01); *H01L 21/67721* (2013.01); *H01L 21/6836* (2013.01)

(58) Field of Classification Search
None
See application file for complete search history.

(56) References Cited

U.S. PATENT DOCUMENTS

| | | | |
|---|---|---|---|
| 8,136,231 B2 | 3/2012 | Schiller | 29/720 |
| 2007/0020800 A1* | 1/2007 | Ishikawa | H01L 21/67144 438/106 |
| 2019/0198371 A1* | 6/2019 | Wagenleitner | H01L 21/67259 |
| 2020/0174383 A1* | 6/2020 | Povazay | G03F 7/70516 |
| 2020/0227319 A1* | 7/2020 | Yamamoto | H01L 21/6836 |
| 2020/0321311 A1* | 10/2020 | Watanabe | H05K 13/04 |
| 2021/0050243 A1* | 2/2021 | Otsuka | H01L 21/68 |

* cited by examiner

*Primary Examiner* — Gerald McClain
(74) *Attorney, Agent, or Firm* — Ostrolenk Faber LLP (57) ABSTRACT

Electronic components are transferred from a source surface for supplying electronic components to a destination surface for receiving electronic components by an ejector device that is locatable at an ejection position for pushing an electronic component mounted on the source surface towards the destination surface. A support device that is locatable at a receiving position supports the electronic component that is pushed onto the destination surface. Further, a pre-transfer imaging device inspects the electronic component before it is transferred from the source surface and a post-transfer imaging device inspects the electronic component after it has been transferred onto the destination surface, wherein the pre-transfer and post-transfer imaging devices are located on opposite sides of the source and destination surfaces.

16 Claims, 6 Drawing Sheets

DIRECT TRANSFER APPARATUS FOR ELECTRONIC COMPONENTS

FIELD OF THE INVENTION

The invention relates to the transfer of electronic components from one surface to another, such as during the sorting and transfer of semiconductor devices.

BACKGROUND AND PRIOR ART

Conventionally, pick-and-place devices are used in the transfer of electronic components such as semiconductor dice comprised in a singulated wafer. The pick-and-place device picks up a die from the singulated wafer and transfers the die to a receiving position on a substrate for die bonding. The die may be bonded to the bonding position on the substrate using force and pressure, or by way of an adhesive. However, it has been found that pick-and-place devices employ relatively slow pick and place motions and mechanisms. Moreover, a collet used by the pick-and-place device to hold onto the dice during transfer is a consumable which has to be discarded when worn, resulting in wastage.

For die-attach applications, a move away from conventional pick-and-place devices has seen the adoption of processes to transfer semiconductor dice from a wafer mounted on one surface onto another surface directly. This is illustrated by U.S. Pat. No. 8,136,231 entitled "Positioning Device and Method for Transferring Electronic Components", wherein a positioning apparatus is used for transferring electronic components from a first flat support surface to a second flat support surface. An ejection device removes electronic components from the first flat support surface by ejection after a camera positioned behind the second flat support surface detects a position of the electronic component to be removed. The ejection device and the camera are arranged essentially on an imaginary common straight line.

Although a camera is used for pattern recognition for electronic components on a wafer prior to conducting the transfer operations, as a focal length of the camera is focused on electronic components on the first flat support surface, real-time post-transfer inspection after each electronic component is transferred for verifying that the die has been correctly transferred onto the second flat support surface cannot be achieved without changing the focal length of the camera. Another problem is that if the same camera is used for inspecting electronic components on the first and second flat support surfaces, the positioning tables for the two flat support surfaces have to move the respective electronic components on the two flat support surfaces to the camera location for inspection. Such a configuration wastes time that is required for table movement during each die transfer cycle. Also, it cannot fulfill a need for real-time pattern recognition and inspection to be conducted on electronic components in parallel during a component transfer cycle. These shortcomings lead to extra time required and lowered throughput during direct die transfer operations.

It is therefore beneficial to provide a transfer apparatus that avoid the aforesaid shortcomings and achieve a faster cycle time.

SUMMARY OF THE INVENTION

It is thus an object of the invention to seek to provide an electronic component transfer apparatus which is able to perform real-time post-transfer inspection when conducting direct transfers of electronic components.

According to a first aspect of the invention, there is provided an apparatus for directly transferring electronic components from a source surface for supplying electronic components to a destination surface for receiving electronic components, the apparatus comprising: an ejector device configured to be locatable at an ejection position for pushing an electronic component mounted on the source surface towards the destination surface; a support device configured to be locatable at a receiving position for supporting the electronic component that is pushed onto the destination surface; a pre-transfer imaging device operative to inspect the electronic component before it is transferred from the source surface and a post-transfer imaging device operative to inspect the electronic component after it has been transferred onto the destination surface, the pre-transfer and post-transfer imaging devices being located on opposite sides of the source and destination surfaces.

According to a second aspect of the invention, there is provided a method for directly transferring electronic components from a source surface for supplying electronic components to a destination surface for receiving electronic components, the method comprising: inspecting an electronic component with a pre-transfer imaging device before it is transferred from the source surface; locating an ejector device at an ejection position for pushing an electronic component mounted on the source surface towards the destination surface; locating a support device at a receiving position for supporting the electronic component that is pushed onto the destination surface; and inspecting the electronic component with a post-transfer imaging device after it has been transferred onto the destination surface; wherein the pre-transfer and post-transfer imaging devices are located on opposite sides of the source and destination surfaces.

It would be convenient hereinafter to describe the invention in greater detail by reference to the accompanying drawings which illustrate specific preferred embodiments of the invention. The particularity of the drawings and the related description is not to be understood as superseding the generality of the broad identification of the invention as defined by the claims.

BRIEF DESCRIPTION OF THE DRAWINGS

An exemplary apparatus for transferring electronic components in accordance with the invention will now be described with reference to the accompanying drawings, in which:

FIG. 3A is an isometric view of an ejector portion of the electronic component transfer apparatus when its ejector swing arm is aligned with a pre-transfer imaging device, while

FIG. 4A is an isometric view of a bin portion of the electronic component transfer apparatus when its bin support swing arm is aligned with a post-transfer inspection device, while

FIGS. 5A to 5D illustrate an electronic component transfer sequence during operation of the electronic component transfer apparatus in accordance with the preferred embodiment of the invention, wherein

DETAILED DESCRIPTION OF THE PREFERRED EMBODIMENT OF THE INVENTION

Figure 1:
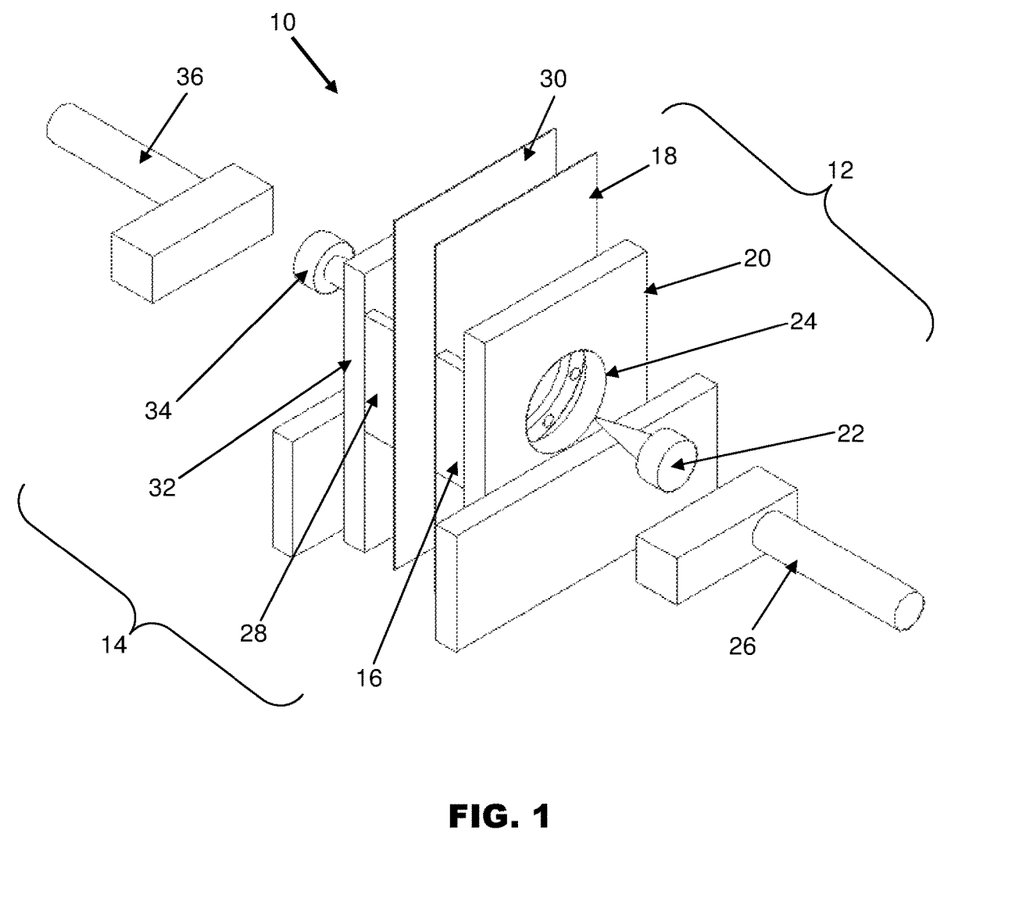
FIG. 1 is an isometric view of major mechanisms of an electronic component transfer apparatus according to the preferred embodiment of the invention.

FIG. 1 is an isometric view of major mechanisms of an electronic component transfer apparatus 10 for directly transferring electronic components from a source surface for supplying electronic components to a destination surface for receiving electronic components according to the preferred embodiment of the invention. Electronic components to be transferred may comprise semiconductor devices or components, such as solid state light emitting diodes ("LEDs"), which have been singulated from a wafer. The electronic component transfer apparatus 10 generally comprises an ejector portion 12 and a bin portion 14.

The ejector portion 12 of the electronic component transfer apparatus 10 has a source surface such as a wafer tape 18 carried on a wafer frame mounting ring 16, which wafer tape 18 usually consists of mylar tape. Such mylar tape may further comprise an adhesive layer to form an adhesive tape, which allows light to pass through the adhesive tape. A wafer comprising a plurality of electronic components 40 (see FIG. 2), such as LED devices, has been adhered to one side of the wafer tape 18. The wafer frame mounting ring 16 is mountable onto a source positioning device, which may be in the form of a wafer table 20, that is operative to move and position the wafer frame mounting ring 16 generally on a first plane along two independent and orthogonal axes. The wafer table 20 is arranged vertically, so that the wafer frame mounting ring 16 is correspondingly movable on a vertical plane.

An ejector device, which may be in the form of an ejector pin 22, is arranged adjacent to the wafer tape 18. The ejector pin 22 is operable to project against the wafer tape 18 to push electronic components 40 in a direction towards the destination surface at the bin portion 14. When the ejector pin 22 is ejecting an electronic component 40, an ejector vacuum generator such as an ejector vacuum ring 24 may be activated at the same time to push the wafer tape 18 in the direction of the bin portion 14 to decrease a separation distance between the ejector portion 12 and the bin portion 14. The ejector vacuum ring 24 has an ejection inspection area 25, which is enclosed by a perimeter of the ejector vacuum ring 24. The ejector pin 22 is operative to pass through the ejection inspection area 25 when it is pushing an electronic component 40.

Further, a pre-transfer imaging device such as a pre-transfer inspection camera 26 is arranged to have a line of sight through the ejection inspection area 25 to an electronic component 40 that is about to be ejected by the ejector pin, 22, in order to perform pre-transfer inspection on electronic components 40 before they are transferred.

The bin portion 14 of the electronic component transfer apparatus 10 has a destination surface such as a bin tape 30 carried by a bin frame mounting ring 28. The bin tape 30 may also consist of mylar tape, which has an adhesive layer for form an adhesive tape, which allows light to pass through the adhesive tape. The bin tape 30 is used for directly receiving a plurality of electronic components 40 that have been ejected from the wafer tape 18. A destination positioning device, which may be in the form of a bin table 32, is operative to move and position the bin frame mounting ring 16 generally on a second plane, again along two independent and orthogonal axes, the second plane being parallel to the first plane. There is a programmable gap or distance between the wafer tape 18 and the bin tape 30, and such gap may be up to a distance of 2 mm.

A support device, which may be in the form of a bin support 34, is arranged adjacent to the bin tape 30 and is operable to project against the bin tape 30 to support an electronic component 40 that is pushed onto the bin tape 30 by the ejector pin 22. Advantageously, the bin support 34 may further push the bin tape 30 in a direction towards the wafer tape 12 located at the ejector portion 12.

The bin support 34 is also used to support an electronic component 40 that has been directly received from the wafer tape 18. A contact surface area of the bin support 34 should be larger than a surface area of each electronic component 40 to ensure an adequately flat and rigid support for each electronic component 40 during the said transfer. When the bin support 34 is pushing against the bin tape 30, a support vacuum generator such as a bin support vacuum ring 42 (see FIG. 2) may be activated at the same time to secure and/or push the bin tape 30 in the direction of the ejector portion 12 to decrease a separation distance between the bin portion 14 and the ejector portion 12. The bin support vacuum ring 42 has a support inspection area 43, which is enclosed by a perimeter of the bin support vacuum ring 42. The bin support 34 is operative to pass through the support inspection area 43 when pushing against the bin tape 30.

Further, a post-transfer imaging device such as a post-transfer inspection camera 36 is arranged to have a line of sight through the support inspection area 43 to an electronic component 40 that has been directly received by the bin tape 30, in order to perform post-transfer inspection of the electronic components 40 after they have been transferred to the bin tape 30. As seen from FIG. 1, the pre-transfer inspection camera 26 and the post-transfer inspection camera 36 are located on opposite sides of the wafer tape 18 and bin tape 30 that are facing each other. Further they are axially aligned with respect to each other in relatively fixed positions.

Figure 2:
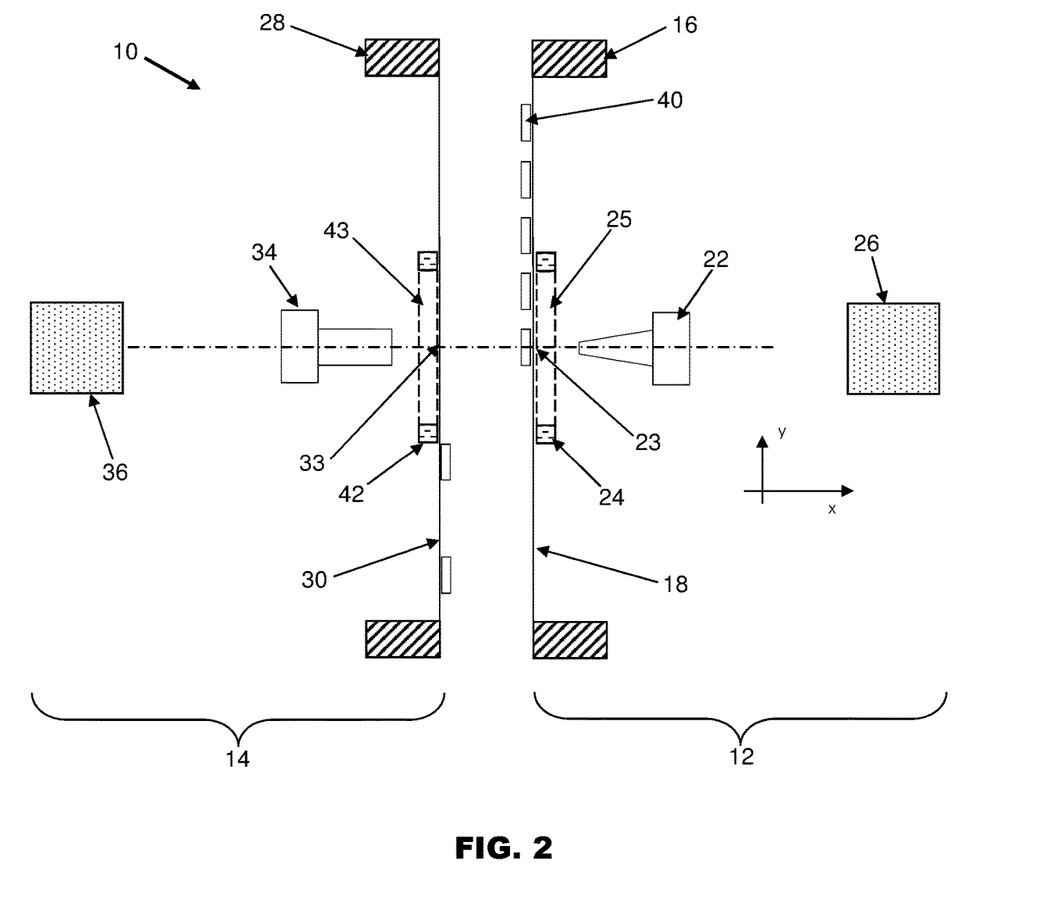
FIG. 2 is a schematic side view of the electronic component transfer apparatus.

FIG. 2 is a schematic side view of the electronic component transfer apparatus 10. It illustrates a standby position of the apparatus 10 wherein the ejector pin 22 and the bin support 34 are axially aligned with the pre-transfer inspection camera 26 and the post-transfer inspection camera 36. The side view of the apparatus 10 shows that the wafer frame mounting ring 16 and the bin frame mounting ring 28 are vertically arranged and oriented, and that the wafer tape 18 and the bin tape 30 are parallel to and facing each other. It should be appreciated that the wafer frame mounting ring 16 and the bin frame mounting ring 28 need not necessarily be vertically arranged, and other orientations such as a horizontal or an inclined arrangement are also possible.

Electronic components 40 that are mounted on the wafer tape 18 are ejected when the ejector pin 22 is moved at an ejection position 23 when pushing an electronic component 40 and the electronic component 40 is directly transferred to a receiving position 33 of the bin tape 30. The receiving position 33 is supportable by the bin support 34 during such transfer. During the said transfer, the ejector vacuum ring 24 and the bin support vacuum ring 42 push the respective wafer tape 18 and bin tape 30 towards each other for enhancing a reliability of the transfer process.

Figure 3A:
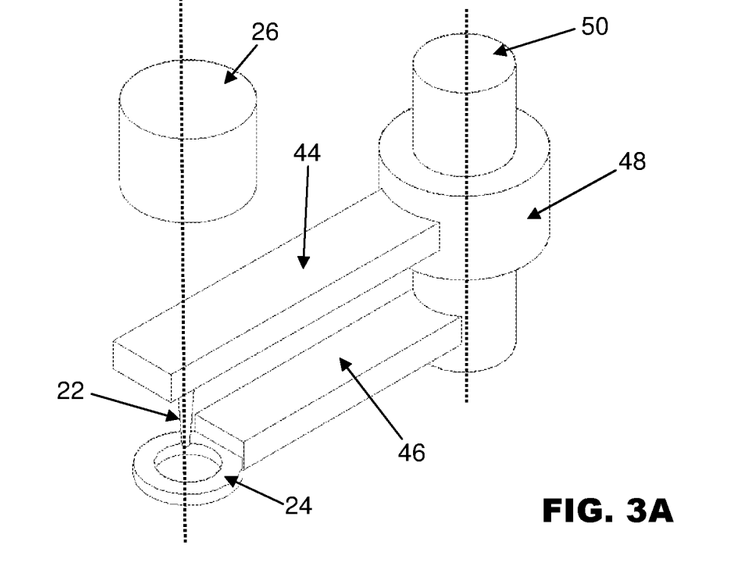
Figure 3B:
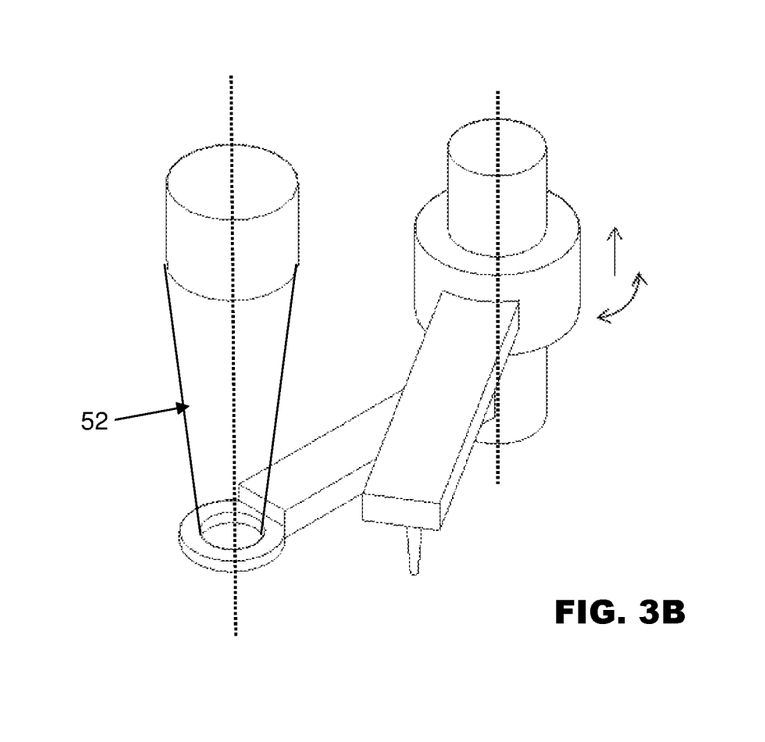
FIG. 3B shows the ejector swing arm having been moved out of alignment with the pre-transfer inspection device.

FIGS. 3A and 3B are isometric views of the ejector portion 12 of the electronic component transfer apparatus 10. In FIG. 3A, the ejector pin 22, which is mounted on an ejector swing arm 44, is aligned with the pre-transfer inspection camera 26. This is the position where the ejector pin 22 may eject an electronic component 40 which is centrally located with respect to the ejector vacuum ring 24. Thus, the ejector pin 22 is positionable by the ejector swing arm 44, the latter being configured to both rotate to swing the ejector pin 22 and to move the ejector pin 22 axially. Travel distances of the ejector swing arm 44 should preferably be programmable.

A rotary position of the ejector swing arm 44 is controlled by an ejector swing arm rotary actuator 48. As for the ejector vacuum ring 24, it is mounted on an ejector vacuum swing arm 46, and its rotary position is controlled by a vacuum ring rotary actuator 50. The ejector vacuum ring 24 is operative to hold the wafer tape 18 firmly during the transfer of an electronic component 40 from the wafer tape 18. Vacuum force on the ejector vacuum ring 24 is activated during transfer of an electronic component 40, and is deactivated when another electronic component 40 is being moved to the ejection position 23.

In FIG. 3B, the ejector swing arm rotary actuator 48 has swung the ejector swing arm 44 and the ejector pin 22 away from the position of the ejector vacuum ring 24. With the ejection swing arm 44 being remote from the ejector vacuum ring 24, the pre-transfer inspection camera 26 is able to view an electronic component 40 that is located within its ejection optical viewing area 52 corresponding to an aperture of the ejector vacuum ring 24. In this position, pre-transfer inspection camera 26 may typically inspect the next electronic component 40 to be ejected, as will be explained in further detail below. Accordingly, the pre-transfer inspection camera 26 is focused at a level where the electronic components 40 are adhered to the wafer tape 18. Hence, positional and rotational inspection can be performed on the target electronic component 40.

Figure 4A:
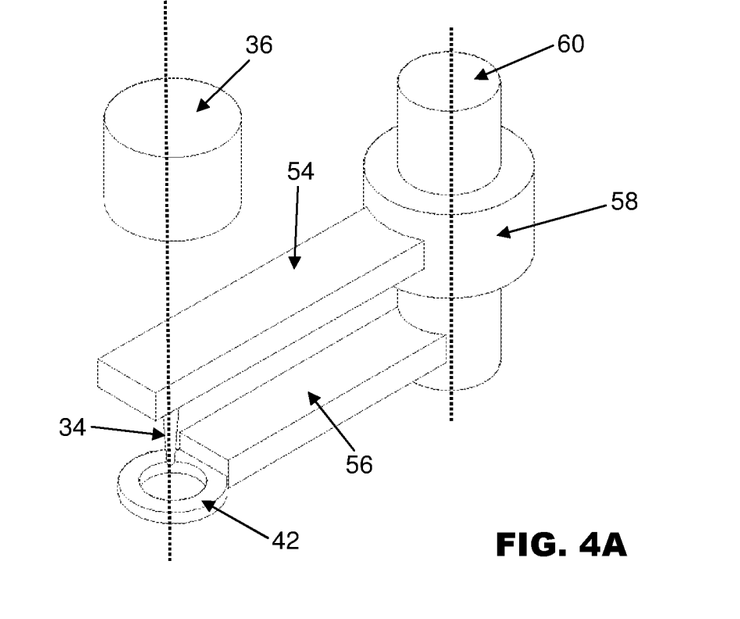
Figure 4B:
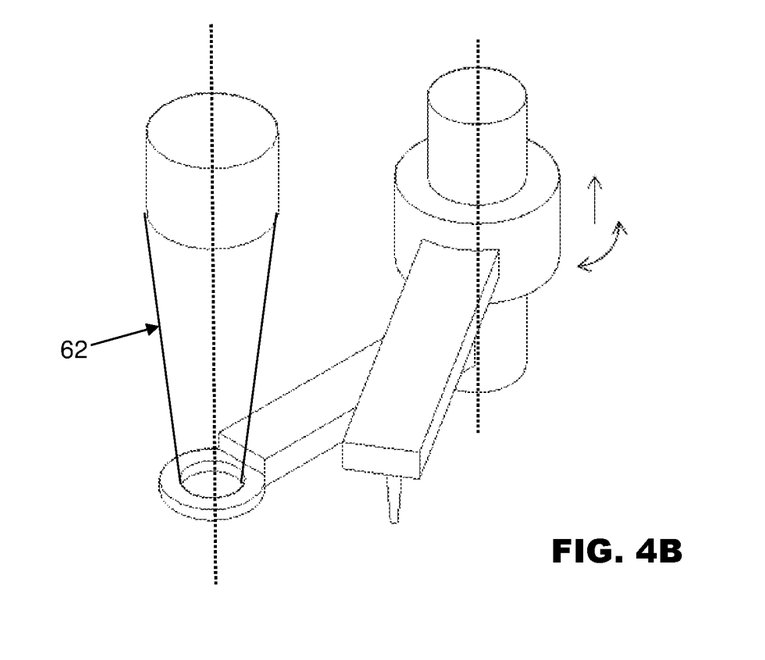
FIG. 4B shows the bin support swing arm having been moved out of alignment with the post-transfer imaging device.

FIGS. 4A and 4B are isometric views of a bin portion 14 of the electronic component transfer apparatus 10. In FIG. 4A, the bin support 34, which is mounted on a bin support swing arm 54, is aligned with the post-transfer inspection camera 36. This is the position where the bin support 34 may support the bin tape 30 when an electronic component 40 is received centrally with respect to the bin support vacuum ring 42. Thus, the bin support 34 is positionable by the bin support swing arm 54, the latter being configured to both rotate to swing the bin support 34 and to move the bin support 34 axially. Travel distances of the bin support swing arm 54 should preferably be programmable.

A rotary position of the bin support swing arm 54 is controlled by a bin support swing arm rotary actuator 58. As for the bin support vacuum ring 42, it is mounted on a bin vacuum ring swing arm 56, and its rotary position is controlled by a bin vacuum ring swing arm rotary actuator 60. The bin support vacuum ring 42 is operative to hold the bin tape 30 firmly when it is receiving an electronic component 40 from the wafer tape 18. Vacuum force on the bin support vacuum ring 42 is activated during transfer of an electronic component 40, and is deactivated when a transferred electronic component 40 is being moved away from the receiving position 33.

In FIG. 4B, the bin support swing arm rotary actuator 58 has swung the bin support swing arm 54 and the bin support 34 away from the position of the bin support vacuum ring 42. With the bin support swing arm 54 being remote from the bin support vacuum ring 42, the post-transfer inspection camera 36 is able to view an electronic component 40 that is located within its bin optical viewing area 62 corresponding to an aperture of the bin support vacuum ring 42. In this position, the post-transfer inspection camera 36 may typically inspect the electronic component 40 that has been received on the bin tape 30, as will be explained in further detail below. Accordingly, the post-transfer inspection camera 36 is focused at a level where the electronic components 40 are adhered to the bin tape 30 after the aforesaid transfer. Hence, positional and rotational inspection can be performed on the transferred electronic component 40, and the result may be utilized for positional compensation or correction in relation to the next component transfer.

Based on the above, it would be appreciated that the ejector pin 22 and the bin support 34 are operable such that they are movable into and out of axial alignment with the pre-transfer and post-transfer inspection cameras 26, 36, whereas the respective inspection cameras 26, 36 may be in relatively fixed positions.

FIGS. 5A to 5D illustrate an electronic component transfer sequence during operation of the electronic component transfer apparatus 10 in accordance with the preferred embodiment of the invention.

Figure 5A:
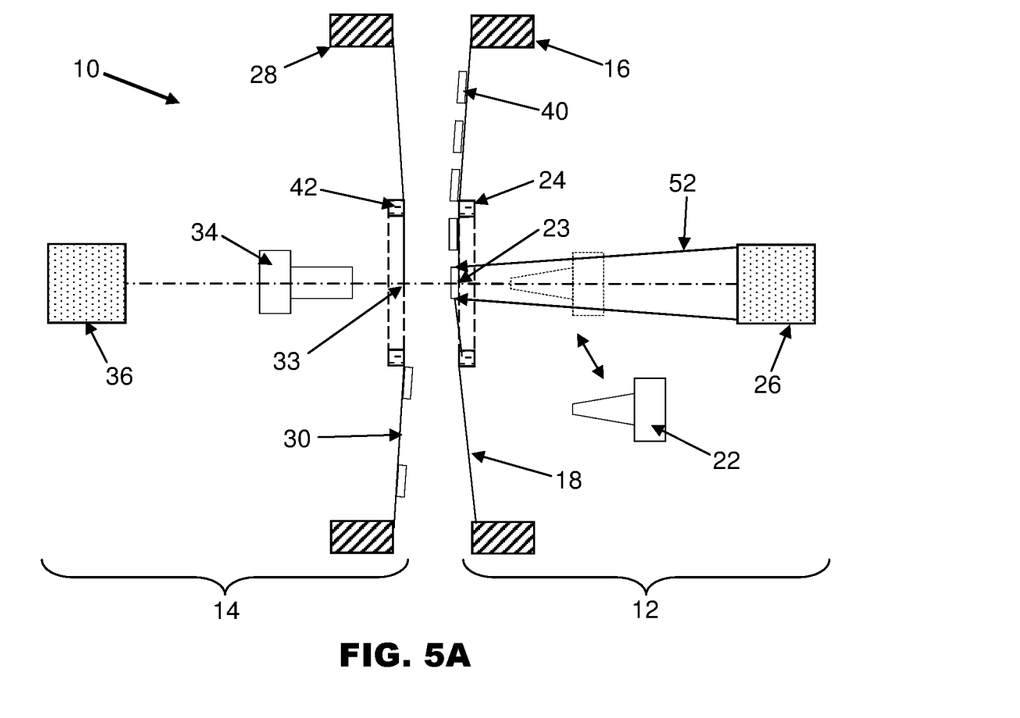
FIG. 5A shows the pre-transfer imaging device inspecting an electronic component.

In FIG. 5A, the ejector pin 22 has swung away from the ejection position 23 and the pre-transfer inspection camera 26 is able to conduct pre-transfer inspection of an electronic component 40 that has been moved to the ejection position 23 centrally of the ejector vacuum ring 24. The ejector vacuum ring 24 and the bin support vacuum ring 42 are in positions which abut against the wafer tape 18 and the bin tape 30 to reduce a gap therebetween.

Figure 5B:
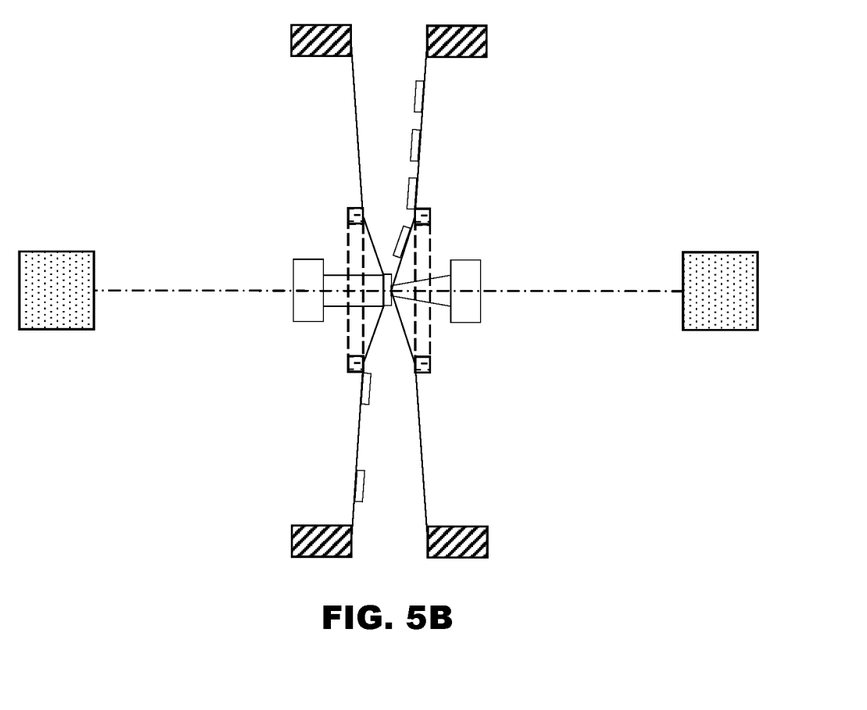
FIG. 5B shows an ejector device pushing against the electronic component in order to transfer it.

In FIG. 5B, after pre-transfer inspection has been completed and the electronic component 40 should be transferred, the ejector pin 22 swings to a position behind the ejector vacuum ring 24. Thereafter, the ejector pin 22 moves axially and projects towards the electronic component 40 to push the wafer tape 18 and electronic component 40, while the bin support 34 moves axially to project towards the bin tape 30 and contacts the back of the bin tape 30 to support the electronic component 40 when it is transferred from the wafer tape 18 to the bin tape 30.

Figure 5C:
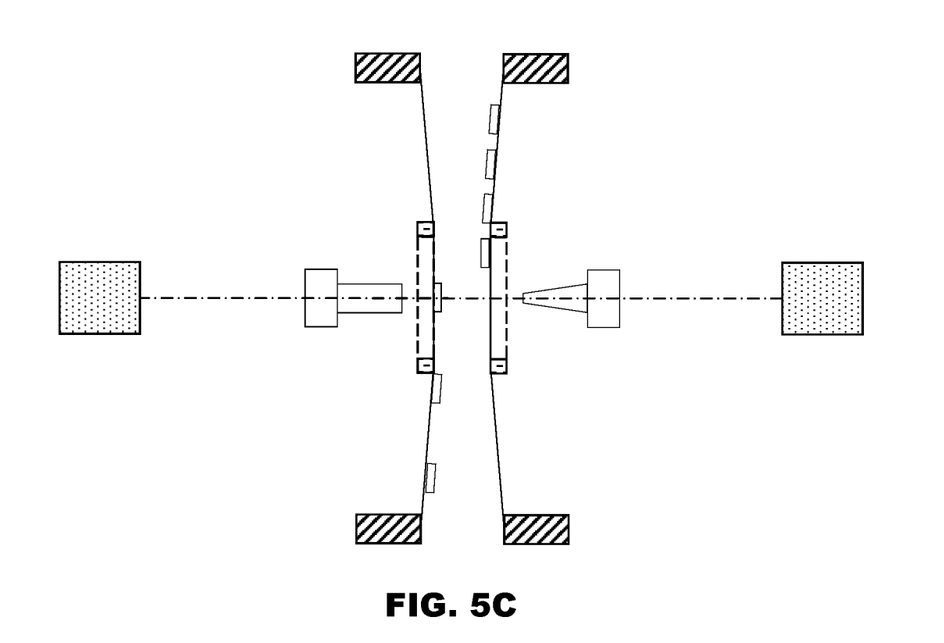
FIG. 5C shows the electronic component having been transferred and FIG. 5D shows the post-transfer imaging device inspecting the transferred electronic component.
Figure 5D:
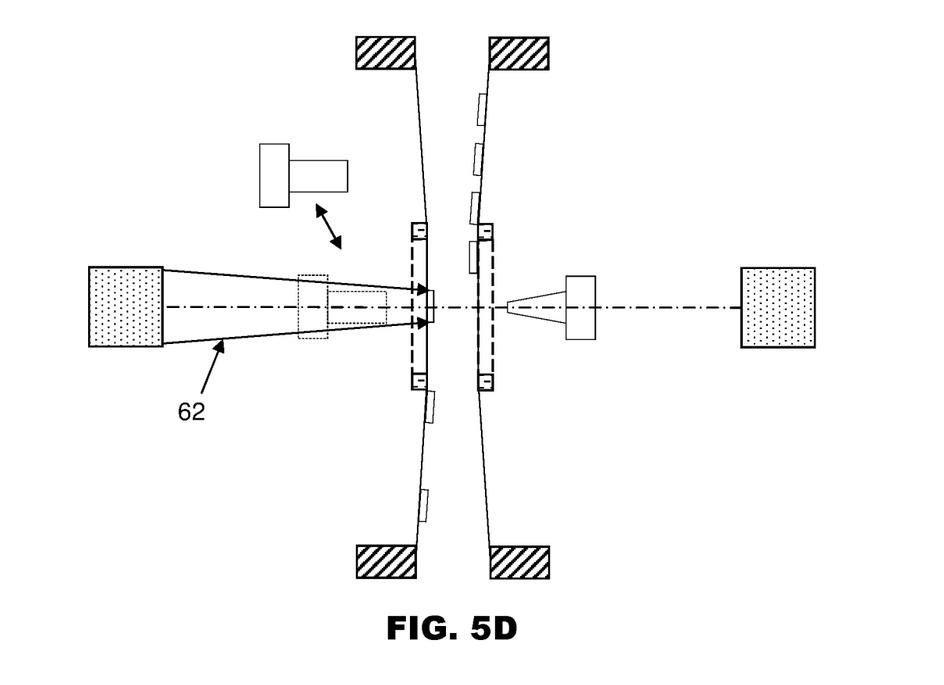

In FIG. 5C, the electronic component 40 has been received by the bin tape 30, and both the ejector pin 22 and the bin support 34 may retract away from the wafer tape 18 and the bin tape 30 respectively. After the said transfer has been completed, the bin support 34 may swing away from the receiving position 33 as shown in FIG. 5D, so that post-transfer inspection of the electronic component 40 may be performed by the post-transfer inspection camera 36 to verify that the transfer has been correctly performed.

The processing steps described with respect to FIGS. 5A to 5D complete a transfer cycle, and the wafer table 20 will then move the wafer tape 18 relative to the ejector pin 22 so as to position another electronic component 40 centrally with respect to the ejector vacuum ring 24. The bin table 32 will also move the bin tape 30 relative to the bin support 34 so as to position a blank portion of the bin tape 30 centrally with respect to the bin support vacuum ring 42 to be ready to receive the next electronic component 40. Subsequent transfer cycles as represented by FIGS. 5A to 5D are then repeatedly conducted until all the electronic components 40 on the wafer tape 18 have been transferred to the bin tape 30.

It would be appreciated that the transfer apparatus according to the preferred embodiment of the invention as described above utilize vertical positioning tables for faceto-face transfers of electronic components from a wafer frame in the form of the wafer frame mounting ring 16 to a bin frame in the form of the bin frame mounting ring 28. Such an arrangement may reduce vibration during high speed motion of the respective wafer frame and bin frame. However, it should also be appreciated that the invention is not limited to vertical alignments of the wafer and bin frames.

Further, there are separate inspection cameras 26, 36 for conducting real-time pre-transfer and post-transfer inspections of electronic components 40 adhered to the wafer tape 18 and the bin tape 30 respectively in respect of each target electronic component 40 before and after its transfer. As each of the ejector pin 22 and bin support 34 is adapted to individually swing into or out of axial alignment with the ejection and receiving positions 23, 33, this allows pattern recognition or inspection as well as transfer of electronic components 40 to be conducted in real time on both the wafer tape 18 and the bin tape 30 simultaneously.

As there is a separate vacuum ring 24, 42 associated individually with both the ejector pin 22 and the bin support 34, this provides a two-stage pushing motion for the wafer tape 18 and the bin tape 30 to increase a gap between the respective tapes where adjacent electronic components 40 that are not being transferred are located. This assists in reducing the risk that electronic components that are adjacent to the target electronic component 40 may collide onto other surfaces and cause damage to the electronic component 40. Furthermore, the reduction of a gap between the tapes 18, 30 at the ejection and receiving positions 23, 33 due to abutment by the ejector vacuum ring 24 and the bin support vacuum ring 42 facilitate the detachment of a target electronic component 40 from the wafer tape 18 and its transfer onto the bin tape 30.

The invention described herein is susceptible to variations, modifications and/or additions other than those specifically described and it is to be understood that the invention includes all such variations, modifications and/or additions which fall within the spirit and scope of the above description.

The invention claimed is:

1. An apparatus for directly transferring electronic components from a source surface for supplying electronic components to a destination surface for receiving electronic components, the apparatus comprising:
   an ejector device configured to be locatable at an ejection position for pushing an electronic component mounted on the source surface towards the destination surface;
   a support device configured to be locatable at a receiving position for supporting the electronic component that is pushed onto the destination surface;
   a pre-transfer imaging device operative to inspect the electronic component before it is transferred from the source surface and a post-transfer imaging device operative to inspect the electronic component after it has been transferred onto the destination surface, the pre-transfer and post-transfer imaging devices being located on opposite sides of the source and destination surfaces.

2. The apparatus as claimed in claim 1, wherein the source and destination surfaces comprise adhesive tapes that allow light to pass through the adhesive tapes.

3. The apparatus as claimed in claim 1, further comprising a source positioning device coupled to the source surface that is operative to move the source surface relative to the ejector device.

4. The apparatus as claimed in claim 3, further comprising a destination positioning device coupled to the destination surface that is operative to move the destination surface relative to the support device.

5. The apparatus as claimed in claim 4, wherein the source and destination positioning devices are operative to move each of the source and destination surfaces separately along two independent and orthogonal axes.

6. The apparatus as claimed in claim 1, wherein the source surface is located on a first plane, and the destination surface is located on a second plane that is parallel to the first plane.

7. The apparatus as claimed in claim 6, wherein the first and second planes are oriented vertically.

8. The apparatus as claimed in claim 1, further comprising an ejector vacuum generator having an ejection inspection area, the ejector device being operative to pass through the ejection inspection area when pushing the electronic component, the ejector vacuum generator being further operative to secure the source surface and to push the electronic components on the source surface towards the destination surface.

9. The apparatus as claimed in claim 8, wherein the pre-transfer imaging device is configured to view the electronic device through the ejection inspection area of the ejector vacuum generator before the electronic component is transferred.

10. The apparatus as claimed in claim 1, wherein the support device is further operable to project against the destination surface to push the destination surface towards the source surface.

11. The apparatus as claimed in claim 10, further comprising a support vacuum generator having a support inspection area, the support vacuum generator being configured for securing the destination surface, and the support device being operative to pass through the support inspection area when pushing the destination surface towards the source surface.

12. The apparatus as claimed in claim 11, wherein the post-transfer imaging device is configured to view the electronic device through the support inspection area of the support vacuum generator after the electronic device has been transferred onto the destination surface.

13. The apparatus as claimed in claim 1, wherein the pre-transfer and post-transfer imaging devices are aligned with each other in relatively fixed positions, and each of the ejector and support devices are operable to be movable into and out of axial alignment with the pre-transfer and post-transfer imaging devices.

14. The apparatus as claimed in claim 13, further comprising an ejection swing arm on which the ejector device is mounted for moving the ejector device into and out of axial alignment with the pre-transfer and post-transfer imaging devices.

15. The apparatus as claimed in claim 1, wherein a contact surface area of the support device is larger than a surface area of each electronic component.

16. A method for directly transferring electronic components from a source surface for supplying electronic components to a destination surface for receiving electronic components, the method comprising:
   inspecting an electronic component with a pre-transfer imaging device before it is transferred from the source surface;
   locating an ejector device at an ejection position for pushing an electronic component mounted on the source surface towards the destination surface;

locating a support device at a receiving position for supporting the electronic component that is pushed onto the destination surface; and inspecting the electronic component with a post-transfer imaging device after it has been transferred onto the destination surface;

wherein the pre-transfer and post-transfer imaging devices are located on opposite sides of the source and destination surfaces.

* * * * *